United States Patent
Kim et al.

(10) Patent No.: US 10,872,994 B2
(45) Date of Patent: Dec. 22, 2020

(54) COMPOUND SEMICONDUCTOR SOLAR CELL

(71) Applicant: LG Electronics Inc., Seoul (KR)

(72) Inventors: Gunho Kim, Seoul (KR); Soohyun Kim, Seoul (KR)

(73) Assignee: LG Electronics Inc., Seoul (KR)

(*) Notice: Subject to any disclaimer, the term of this patent is extended or adjusted under 35 U.S.C. 154(b) by 8 days.

(21) Appl. No.: 15/833,692

(22) Filed: Dec. 6, 2017

(65) Prior Publication Data

US 2018/0158975 A1    Jun. 7, 2018

(30) Foreign Application Priority Data

Dec. 6, 2016 (KR) .................. 10-2016-0165020

(51) Int. Cl.
*H01L 31/056*    (2014.01)
*H01L 31/0224*   (2006.01)
(Continued)

(52) U.S. Cl.
CPC .... *H01L 31/056* (2014.12); *H01L 31/022425* (2013.01); *H01L 31/0693* (2013.01);
(Continued)

(58) Field of Classification Search
CPC ......... H01L 31/0224; H01L 31/022433; H01L 31/022441; H01L 31/056; H01L 31/0682; Y02E 10/544
See application file for complete search history.

(56) References Cited

U.S. PATENT DOCUMENTS

2011/0000531 A1* 1/2011 Kwag ............... H01B 1/16
136/255
2011/0023958 A1* 2/2011 Masson ........... H01L 31/0201
136/256
(Continued)

FOREIGN PATENT DOCUMENTS

KR    10-2012-0087513    8/2012
KR    10-1193021         10/2012
(Continued)

OTHER PUBLICATIONS

International Search Report in International Application No. PCT/KR2017/014050, dated Dec. 4, 2017, 3 pages (with English translation).

*Primary Examiner* — Daniel P Malley, Jr.
(74) *Attorney, Agent, or Firm* — Fish & Richardson P.C.

(57) ABSTRACT

According to an aspect of the present invention, there is provided a compound semiconductor solar cell, comprising: a light absorbing layer comprising a compound semiconductor; a first electrode positioned on a front surface of the light absorption layer; a first contact layer positioned between the light absorbing layer and the first electrode; a second electrode positioned on a rear surface of the light absorbing layer and having a sheet shape; and a second contact layer positioned between the light absorbing layer and the second electrode. The second contact layer is partially formed on the rear surface of the light absorbing layer on the projection surface, and the second electrode includes a first portion in direct contact with the second contact layer and a second portion located between the first portions.

20 Claims, 9 Drawing Sheets

(51) Int. Cl.
*H01L 31/0693* (2012.01)
*H01L 31/0216* (2014.01)
(52) U.S. Cl.
CPC ......... *H01L 31/02168* (2013.01); *Y02E 10/52* (2013.01); *Y02E 10/544* (2013.01)

(56) References Cited

U.S. PATENT DOCUMENTS

| | | | | |
|---|---|---|---|---|
| 2011/0124146 | A1* | 5/2011 | Pitera | H01L 31/0687 438/64 |
| 2012/0048365 | A1* | 3/2012 | Lee | H01L 31/022425 136/256 |
| 2012/0255600 | A1* | 10/2012 | Bedell | H01L 31/03926 136/255 |
| 2013/0056051 | A1* | 3/2013 | Jin | H01L 31/068 136/255 |
| 2013/0087191 | A1* | 4/2013 | Tan | H01L 31/1804 136/256 |
| 2017/0012149 | A1* | 1/2017 | Hao | H01L 31/1804 |

FOREIGN PATENT DOCUMENTS

| | | |
|---|---|---|
| KR | 10-2013-0065446 | 6/2013 |
| KR | 10-2014-0078784 | 6/2014 |
| KR | 10-2015-0076881 | 7/2015 |
| KR | 10-2015-0092608 | 8/2015 |

* cited by examiner

COMPOUND SEMICONDUCTOR SOLAR CELL

CROSS-REFERENCE TO RELATED APPLICATION

This application claims priority to and the benefit of Korean Patent Application No. 10-2016-0165020 filed in the Korean Intellectual Property Office on Dec. 6, 2016, the entire contents of which are incorporated herein by reference.

TECHNICAL FIELD

Implementations of the invention relate to a compound semiconductor solar cell, and more particularly to a compound semiconductor solar cell having a local rear contact layer.

BACKGROUND

A compound semiconductor is not made of a single element such as silicon (Si) and germanium (Ge) and is formed by a combination of two or more kinds of elements to operate as a semiconductor. Various kinds of compound semiconductors have been currently developed and used in various fields. The compound semiconductors are typically used for a light emitting element, such as a light emitting diode and a laser diode, and a solar cell using a photoelectric conversion effect, a thermoelectric conversion element using a Peltier effect, and the like.

A compound semiconductor solar cell uses a compound semiconductor in a light absorbing layer that absorbs solar light and generates electron-hole pairs. The light absorbing layer is formed using a III-V compound semiconductor such as GaAs, InP, GaAlAs and GaInAs, a II-VI compound semiconductor such as CdS, CdTe and ZnS, a compound semiconductor such as $CuInSe_2$.

A plurality of compound semiconductor solar cells each having the above-described configuration is connected in series or in parallel to configure a solar cell module.

FIG. 1 schematically illustrates a configuration of a compound semiconductor solar cell according to a related art.

A compound semiconductor solar cell shown in FIG. 1 comprises a light absorbing layer PV, a window layer 10 positioned on the front surface of the light absorbing layer PV, a first electrode 20 positioned on the front surface of the window layer 10, a first contact layer 30 positioned between the window layer 10 and the first electrode 20, an anti-reflection film 40 positioned on the window layer 10, a second contact layer 40 positioned on the rear surface of the light absorbing layer PV, and a second electrode 60 positioned on the rear surface of the second contact layer 50.

In the compound semiconductor solar cell having such a structure, light is transmitted through a light incident surface of the solar cell. In some implementations, light is transmitted through the anti-reflection film 40 of the solar cell. The solar cell in FIG. 1 can reflect at least a portion of this light without being absorbed in the light absorbing layer PV. The second electrode 60 of the solar cell can include the same area as the light absorbing layer PV to reflect at least a portion of the light. In addition, to improve the electrical performance by reducing the contact resistance between the light absorbing layer PV and the second electrode 60, the second contact layer 50 is formed to have the same area as the second electrode 60.

Thus, the entire rear surface of the light absorbing layer PV is covered by the second contact layer 50, and the entire rear surface of the second contact layer 50 is covered by the second electrode 60.

Therefore, in the conventional compound semiconductor solar cell in which the second contact layer 50 is located on the entire rear surface of the light absorbing layer PV, the contact resistance between the second electrode 60 and the light absorbing layer PV can be reduced due to the use of the second contact layer 50. But a portion of light transmitted through the light absorbing layer PV without being absorbed in the light absorbing layer PV is absorbed in the second contact layer 50.

That is, the incident light transmitted through the light absorbing layer PV is reflected by the second electrode 60 after passing through the second contact layer 50. The light reflected from the second electrode 60 is again transmitted through the second contact layer 50 and then incident on the light absorbing layer PV again. Accordingly, the incident light transmitted through the light absorbing layer PV passes through the second contact layer 50 twice or more until it is incident on the light absorbing layer PV again. In this process, a part of the light transmitted through the second contact layer 50 is absorbed by the second contact layer 50.

Accordingly, the second contact layer 50 has the advantages of improving the electrical performance of the compound semiconductor solar cell and the problem of hindering the optical performance.

SUMMARY

An object of the present invention is to provide a compound semiconductor solar cell capable of simultaneously improving the optical performance and the electrical performance by increasing the reflectance of light transmitted through the light absorption layer.

According to an aspect of the present invention, there is provided a compound semiconductor solar cell, comprising: a light absorbing layer comprising a compound semiconductor; a first electrode positioned on a front surface of the light absorption layer; a first contact layer positioned between the light absorbing layer and the first electrode; a second electrode positioned on a rear surface of the light absorbing layer and having a sheet shape; and a second contact layer positioned between the light absorbing layer and the second electrode. The second contact layer is partially formed on the rear surface of the light absorbing layer on the projection surface, and the second electrode includes a first portion in direct contact with the second contact layer and a second portion located between the first portions.

In this instance, the second portion may be in direct contact with the light absorbing layer and may be formed to be thicker than the first portion by about 100 nm to 300 nm, and the thickness difference may be caused by the second contact layer. Thus, the second portion may be formed thicker than the first portion by the thickness of the second contact layer.

The compound semiconductor solar cell may further comprise a window layer positioned between the light absorption layer and the first contact layer and an anti-reflection film positioned on the window layer.

The second contact layer may include a plurality of dots spaced apart with each other. In some implementations, a sum of areas of the plurality of dots may be from 10% to 50% of the area of the light absorbing layer or the area of the second electrode. In some implementations, the sum of the areas of the plurality of dots may be 10% of the area of the light absorbing layer or the area of the second electrode. In these implementations, the areas can represent areas in a particular plane, e.g., an X-Y plane.

Each of the plurality of dots may be formed in a circular, elliptical, or quadrangular planar shape having a size of 5 μm to 100 μm. The plurality of dots may be formed to have the same size within the range (i.e., 5 μm to 100 μm). The plurality of dots may be formed in at least two different sizes within the range.

The plurality of dots may be uniformly arranged in a lattice shape or a rhombic shape.

In this instance, a distance between two dots arranged in any one column of the four dots arranged in one lattice shape or one rhomboid shape may be 10 μm to 200 μm.

And a distance between two dots arranged in any one row of the four dots arranged in one lattice shape may be 10 μm to 200 μm, and a distance between two dots arranged in any one row of the four dots arranged in one rhombic shape may be 15 μm to 350 μm.

Alternatively, a plurality of dots may be randomly arranged.

When the second contact layer includes a plurality of dots, the second contact layer may further include a linear portion located in a region overlapping the first electrode on a projection plane. The linear portion and the first electrode may be formed to have the same planar area or may be formed to have different planar areas.

The second contact layer may comprise a plurality of first linear portions spaced apart from each other. In some implementations, a sum of planar area of each of the plurality of first linear portions may be 10% to 50% of an area of each of the light absorbing layer and the second electrode. Preferably, the sum of the planar area of each of the plurality of first linear portions may be 10% of the planar area of each of the light absorbing layer and the second electrode.

The plurality of first linear portions may be formed in a lattice pattern and may be formed to have the same line widths (for example, 1.2 μm).

In the instance, two first linear portions adjacent to each other in the first direction may be arranged to maintain an interval of 30 μm to 200 μm along the first direction, and two first linear portions adjacent to each other in a second direction orthogonal to the first direction may be arranged to maintain an interval of 30 μm to 200 μm along the second direction.

In the compound semiconductor solar cell according to the present invention, the second contact layer for reducing the contact resistance between the sheet-shaped second electrode formed in the same size as the light absorbing layer and the light absorbing layer is locally or partially positioned on the rear surface of the light absorbing layer and the rear surface of the light absorbing layer in the region where the second contact layer is not formed is in direct contact with the second electrode.

Therefore, since the amount of light absorbed in the second contact layer among the light transmitted through the light absorbing layer can be reduced, the light loss due to the second contact layer can be reduced. Also, the problem caused by an increase in contact resistance between the light absorbing layer and the second electrode can be solved. Accordingly, the efficiency of the compound semiconductor solar cell can be improved.

DETAILED DESCRIPTION

Figure 1:
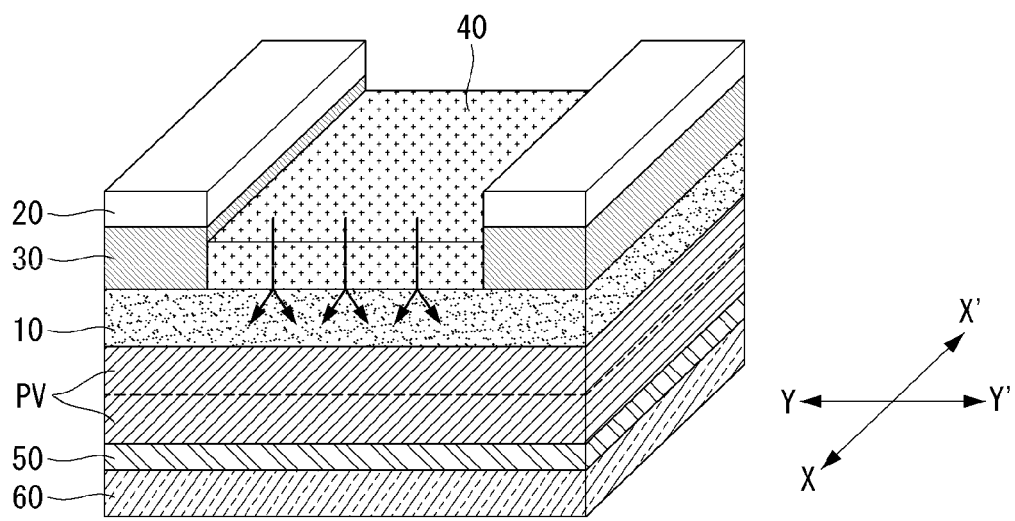
FIG. 1 is a perspective view illustrating a conventional compound semiconductor solar cell.

Reference will now be made in detail to implementations of the invention examples of which are illustrated in the accompanying drawings. Since the invention may be modified in various ways and may have various forms, specific implementations are illustrated in the drawings and are described in detail in the specification. However, it should be understood that the invention are not limited to specific disclosed implementations, but include all modifications, equivalents and substitutes included within the spirit and technical scope of the invention.

The terms 'first', 'second', etc., may be used to describe various components, but the components are not limited by such terms. The terms are used only for the purpose of distinguishing one component from other components.

For example, a first component may be designated as a second component without departing from the scope of the implementations of the invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component (s) may exist between them, although the arbitrary component may be directly connected to, or linked to, the second component.

On the other hand, when an arbitrary component is described as "being directly connected to" or "being directly linked to" another component, this should be understood to mean that no other component exists between them.

The terms used in this application are used to describe only specific implementations or examples, and are not intended to limit the invention. A singular expression can include a plural expression as long as it does not have an apparently different meaning in context.

In this application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless otherwise specified, all of the terms which are used herein, including the technical or scientific terms, have the same meanings as those that are generally understood by a person having ordinary knowledge in the art to which the invention pertains.

The terms defined in a generally used dictionary must be understood to have meanings identical to those used in the context of a related art, and are not to be construed to have ideal or excessively formal meanings unless they are obviously specified in this application.

The following example implementations of the invention are provided to those skilled in the art in order to describe the invention more completely. Accordingly, shapes and sizes of elements shown in the drawings may be exaggerated for clarity.

Hereinafter, a compound semiconductor solar cell according to an implementation of the present invention will be described with reference to the accompanying drawings.

Figure 2:
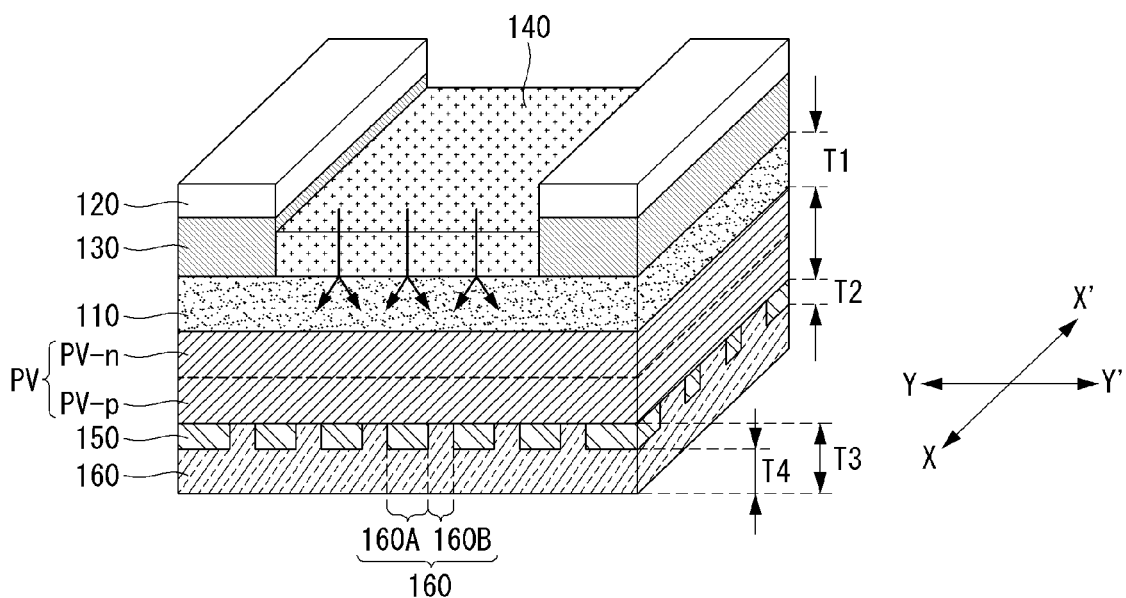
FIG. 2 is a perspective view illustrating a compound semiconductor solar cell according to an implementation of the present invention.
Figure 3:
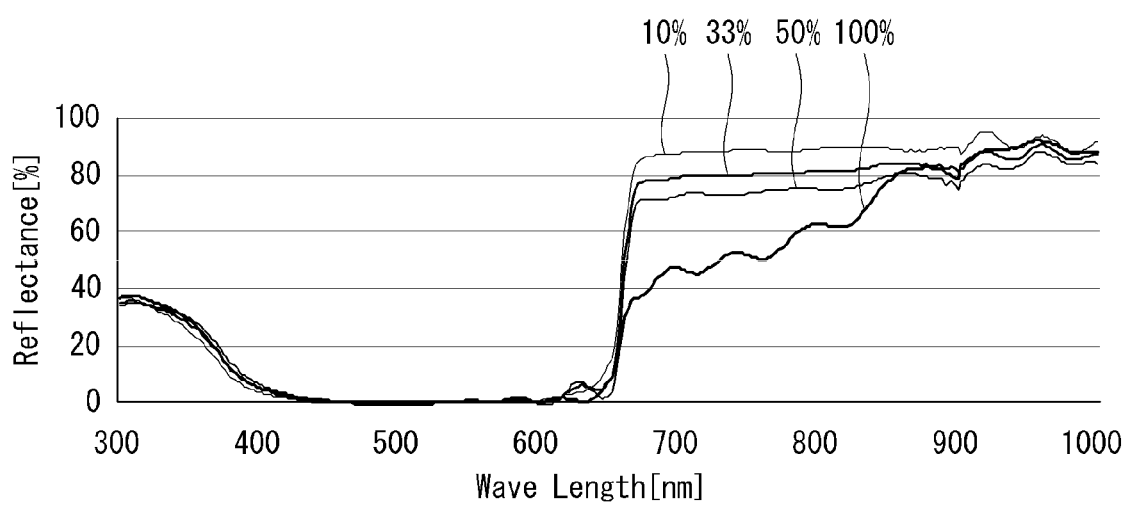
FIG. 3 is a graph showing a change of the back reflectance at the second electrode depending on a contact ratio between the second contact layer and the second electrode.

FIG. 2 is a perspective view illustrating a compound semiconductor solar cell according to an implementation of the present invention. FIG. 3 is a graph showing a change of the back reflectance at the second electrode depending on a contact ratio between the second contact layer and the second electrode.

Figure 4:
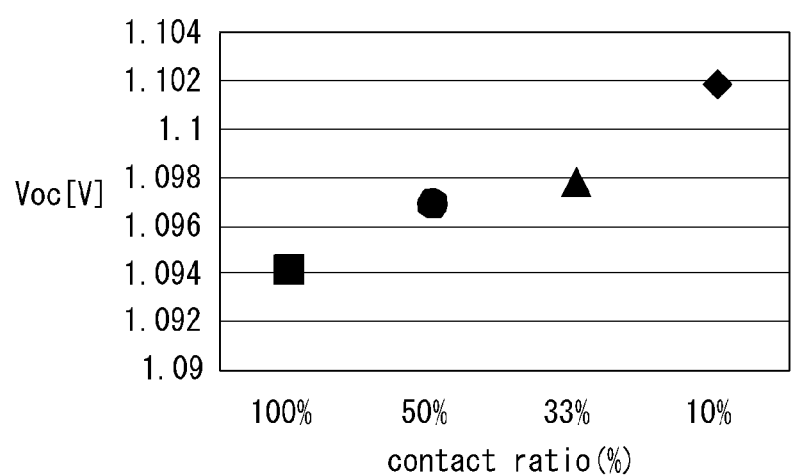
FIG. 4 is a graph showing changes of the open-circuit voltage Voc and the short-circuit current density Jsc according to the contact ratio between the second contact layer and the second electrode.
Figure 4:
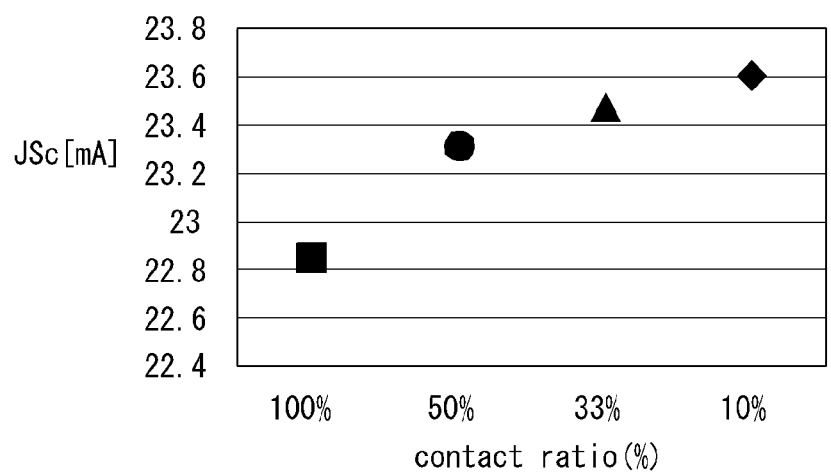
Figure 5:
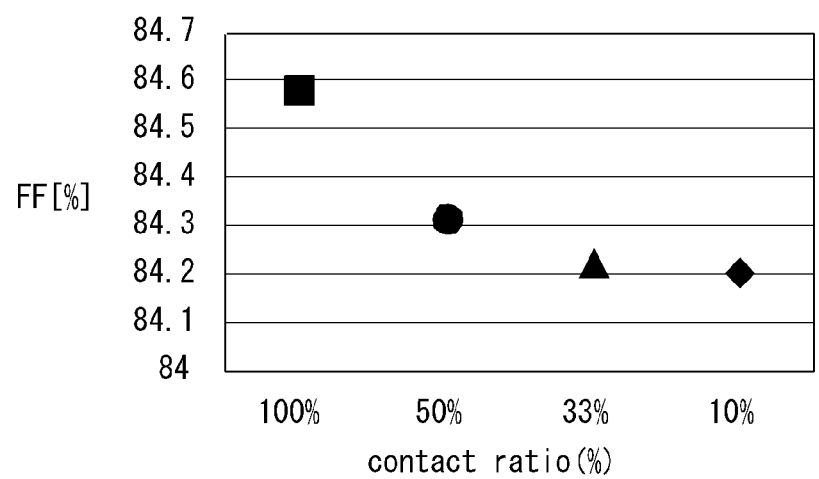
FIG. 5 is a graph showing changes of the Fill factor F.F. and the efficiency Eff according to the contact ratio between the second contact layer and the second electrode.
Figure 5:
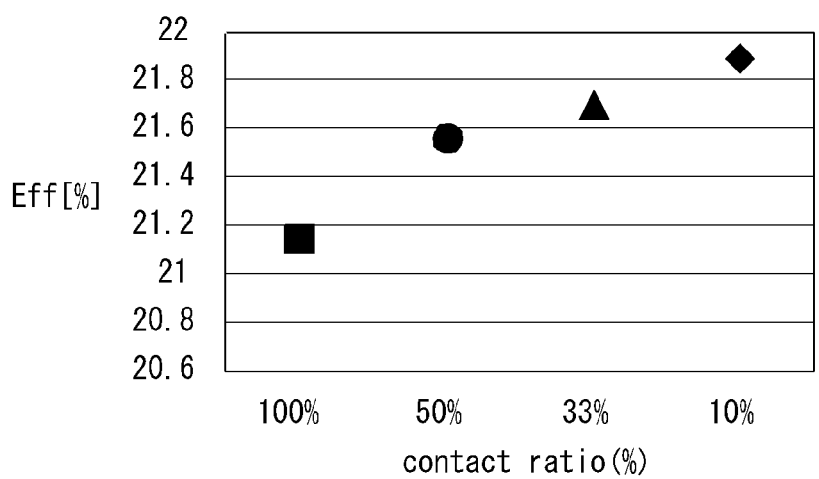

FIG. 4 is a graph showing changes of the open-circuit voltage Voc and the short-circuit current density Jsc according to the contact ratio between the second contact layer and the second electrode. FIG. 5 is a graph showing changes of the Fill factor F.F. and the efficiency Eff according to the contact ratio between the second contact layer and the second electrode.

FIGS. 6 to 10 are plan views showing various implementations of the second contact layer shown in FIG. 2.

A compound semiconductor solar cell of an implementation of the present invention may comprise a light absorbing layer PV, an window layer 110 positioned on a front surface of the light absorption layer, a first electrode 120 positioned on a front surface of the window layer 110, a first contact layer 130 positioned between the window layer 110 and the first electrode 120, an anti-reflection film 140 positioned on the window layer 110, a second contact layer 150 positioned on a rear surface of the light absorbing layer PV, and a second electrode positioned on a rear surface of the second electrode.

In the instance, at least one of the anti-reflection film 140 and the window layer 110 may be omitted, but a case where the anti-reflection film 140 and the window layer 110 are provided as shown in FIG. 2 will be described as an example.

The light absorbing layer PV may be formed to include a III-VI group semiconductor compound. For example, the light absorbing layer PV may be formed of an InGaP compound containing indium (In), gallium (Ga) and phosphide (P) or a GaAs compound containing gallium (Ga) and arsenic (As).

Hereinafter, a description will be given of an example in which the light absorption layer PV includes a GaAs compound.

The light absorbing layer PV may include a p-type semiconductor layer PV-p doped with an impurity of a first conductive type and an n-type semiconductor layer PV-n doped with an impurity of a second conductive type opposite the first conductive type.

The light absorbing layer PV may further include a back surface field layer.

The p-type semiconductor layer PV-p may be formed by doping a p-type impurity into the above-described compound, and the n-type semiconductor layer PV-n may be formed by doping an n-type impurity into the above-described compound.

Herein, the p-type impurity may be selected from carbon, magnesium, zinc or a combination thereof, and the n-type impurity may be selected from silicon, selenium, tellurium or a combination thereof.

The n-type semiconductor layer PV-n may be positioned in a region adjacent to the first electrode 120. The p-type semiconductor layer PV-p may be positioned in a region directly under the n-type semiconductor layer PV-n and may be positioned in a region adjacent to the second electrode 160.

As a result, a p-n junction in which the p-type semiconductor layer PV-p and the n-type semiconductor layer PV-n are joined is formed in the light absorbing layer PV. The electron-hole pairs generated by the light are separated into electrons and holes by the internal potential difference formed by the p-n junction of the light absorbing layer PV so that electrons move toward the n-type semiconductor layer PV-n and holes move toward the p-type semiconductor layer PV-p.

Therefore, the holes generated in the light absorbing layer PV move to the second electrode 160 through the second contact layer 150 and the electrons generated in the light absorbing layer PV moves to the first electrode 120 through the window layer 110 and the first contact layer 130.

Alternatively, the p-type semiconductor layer PV-p may be positioned in a region adjacent to the first electrode 120 and the n-type semiconductor layer PV-n may be positioned in a region directly under the p-type semiconductor layer PV-p and may be positioned in a region adjacent to the second electrode 160. In this instance, the holes generated in the light absorbing layer PV move to the first electrode 120 through the first contact layer 130 and the electrons generated in the light absorbing layer PV move to the second electrode 160 through the second contact layer 150.

In the case where the light absorbing layer PV further includes the back surface field layer, the back surface field layer may have the same conductivity as the upper layer, that is, the n-type semiconductor layer PV-n or the p-type semiconductor layer PV-p and may be may be formed of the same material as the window layer 110.

In order to effectively block the movement of the charge (holes or electrons) to be moved toward the first electrode toward the second electrode, the back surface field layer is formed entirely on the rear surface of the upper layer directly contacting with the back surface field layer, that is, the n-type semiconductor layer PV-n or the p-type semiconductor layer PV-p.

That is, in the solar cell shown in FIG. 2, in the case where the back surface field layer is formed on the rear surface of the p-type semiconductor layer PV-p, the back surface field layer functions to block the movement of electrons toward the second electrode. In order to effectively block the movement of electrons toward the second electrode, the back surface field layer is positioned on the entire rear surface of the p-type semiconductor layer PV-p.

The light absorbing layer PV having such a structure may be formed on a mother substrate by a metal organic chemical vapor deposition (MOCVD) method, a molecular beam epitaxy (MBE) method, or any other suitable method for forming an epitaxial layer.

The mother substrate may serve as a base providing a suitable lattice structure in which a light absorbing layer PV is formed, and may be formed of a group III-V compound containing gallium arsenide (GaAs).

The mother substrate may be a substrate that was previously used to fabricate one or more compound semiconductor solar cells.

That is, the mother substrate can be separated from the compound semiconductor solar cell at several points in the manufacturing process, and can be reused for manufacturing other compound semiconductor solar cells.

In the case of homogeneous junction, the p-type semiconductor layer PV-p and the n-type semiconductor layer PV-n may be made of the same material having the same band gap. Alternatively, in the case of heterojunction, the p-type semiconductor layer PV-p and the n-type semiconductor layer PV-n may be made of different materials having different band gaps.

The window layer 110 may be formed between the light absorbing layer PV and the first electrode 120 and may be formed by doping an impurity of the second conductivity type into a III-VI group semiconductor compound.

However, when the p-type semiconductor layer PV-p is positioned on the n-type semiconductor layer PV-n and the window layer 110 is positioned on the p-type semiconductor layer PV-p, the window layer 110 may include a first conductivity type (i.e., a p-type) impurity.

However, the window layer 110 may not contain n-type or p-type impurities.

The window layer 110 serves to passivate the front surface of the light absorbing layer PV. Therefore, when the carrier (electrons or holes) moves to the surface of the light absorbing layer PV, the window layer 110 can prevent the carriers from recombining on the surface of the light absorbing layer PV.

Since the window layer 110 is disposed on the front surface (i.e., light incident surface) of the light absorbing layer PV, in order to prevent light incident on the light absorbing layer PV from being absorbed, the window layer 110 may have an energy band gap higher than the energy band gap of the light absorbing layer PV.

In order to form the energy band gap of the window layer 110 higher than the energy band gap of the light absorption layer, the window layer 110 may further contain aluminum (Al).

The anti-reflection film 140 may be located on the entire surface of the window layer 110 except the region where the first electrode 120 and/or the first contact layer 130 are located. The anti-reflection film 140 reduces the reflectance of incident light and increases the selectivity of a specific wavelength region of the incident light, thereby increasing the efficiency of the solar cell.

Alternatively, the anti-reflection film 140 may be disposed on the first contact layer 130 and the first electrode 120 as well as the exposed window layer 110.

In this instance, the compound semiconductor solar cell may further include at least one bus bar electrodes physically connecting the plurality of first electrodes 120, and the bus bar electrode may not be covered by the anti-reflection film 140 and can be exposed to the outside.

The anti-reflection film 140 having such a structure may include magnesium fluoride, zinc sulfide, titanium oxide, silicon oxide, derivatives thereof, or a combination thereof.

The first electrode 120 may be formed to extend in the first direction X-X', and a plurality of the first electrodes 120 may be spaced apart from each other along a second direction Y-Y' orthogonal to the first direction.

The first electrode 120 may be formed to include an electrically conductive material. For example, the first electrode 120 may include at least one of gold (Au), germanium (Ge), and nickel (Ni).

The first contact layer 130 positioned between the window layer 110 and the first electrode 120 is formed by doping the second impurity with a dopant concentration higher than the impurity doping concentration of the window layer 110 into the III-V compound semiconductor.

The first contact layer 130 forms an ohmic contact between the window layer 110 and the first electrode 120. That is, when the first electrode 120 directly contacts the window layer 110, the ohmic contact between the first electrode 120 and the light absorbing layer PV is not well formed because the impurity doping concentration of the window layer 110 is low. Therefore, the carrier moved to the window layer 110 cannot move to the first electrode 120 and can be destroyed.

However, when the first contact layer 150 is formed between the first electrode 120 and the window layer 110, since the first contact layer 150 forms an ohmic contact with the first electrode 120, the carrier is smoothly moved and the short circuit current density Jsc of the compound semiconductor solar cell increases. Thus, the efficiency of the solar cell can be further improved.

In order to form an ohmic contact with the first electrode 120, the doping concentration of the second dopant doped in the first contact layer 130 may be greater than the doping concentration of the second dopant doped in the window layer 110.

The first contact layer 130 is formed in the same shape as the first electrode 120.

A second contact layer 150 disposed on the rear surface of the p-type semiconductor layer PV-p of the light absorbing layer PV (or the back surface of the back surface field layer when the light absorbing layer PV includes the back surface field layer) is locally or partially located on the rear surface of the light absorbing layer PV on the projection plane. The second contact layer 150 may be formed by doping the first conductive type impurity into the III-VI group semiconductor compound at a doping concentration higher than that of the p-type semiconductor layer PV-p.

The second contact layer 150 forms an ohmic contact with the second electrode 160, so that the short circuit current density Jsc of the compound semiconductor solar cell can be further improved. Thus, the efficiency of the solar cell can be further improved.

The thickness T1 of the first contact layer 130 and the thickness T2 of the second contact layer 150 may each be 100 nm to 300 nm. For example, the first contact layer 130 may be formed with a thickness T1 of 100 nm and the second contact layer 150 may be formed with a thickness T2 of 300 nm.

The second electrode 160 positioned on the rear surface of the second contact layer 150 may be a sheet-like conductive layer positioned entirely on the rear surface of the light absorbing layer PV, different from the first electrode 120.

That is, the second electrode 160 may be referred to as a sheet electrode located on the entire rear surface of the light absorbing layer PV.

At this time, the second electrode 160 may be formed in the same planar area as the light absorbing layer PV.

Therefore, as described above, the second contact layer 150 is partially or locally disposed on the rear surface of the light absorbing layer PV on the projection surface, and the second electrode 160 is formed in a sheet shape. Therefore, the second electrode 160 includes a first portion 160A in direct contact with the second contact layer 150 and a second portion 160B located between the first portions 160A.

At this time, the second portion 160B may directly contact the p-type semiconductor layer PV-p of the light absorbing layer PV, and the thickness T3 of the second portion 160B may be formed thicker than the thickness T4 of the first portion 160A by the thickness T2 of the second contact layer 150.

FIG. 3 is a graph showing a change of the back reflectance at the second electrode depending on a contact ratio between the second contact layer and the second electrode. FIG. 3 shows a case where the contact ratios are 10%, 33%, 50%, and 100%, respectively. Referring to FIG. 3, it can be seen that the back reflectance at the second electrode increases as the contact ratio decreases.

In FIG. 3, the contact ratio indicates the size of the second contact layer in contact with the second electrode as a percentage when the planar area of the second electrode is 100. When the contact ratio is 100%, the second contact layer 150 and the second electrode 160 are formed so as to have the same planar areas as each other.

Therefore, it is understood that the contact ratio between the second contact layer and the second electrode is kept low in order to improve the optical performance.

However, as the contact ratio between the second contact layer and the second electrode is lowered in order to improve the optical performance, the area of the second contact layer is reduced, thereby deteriorating the electrical performance of the compound semiconductor solar cell.

Referring to FIGS. 4 and 5, as the contact ratio between the second contact layer 50 and the second electrode 60 decreases, the back reflectance increases and the open-circuit voltage Voc and the short-circuit current density Jsc increase. However, it can be seen that the fill factor FF decreases due to the reduction of the contact area of the second contact layer and the second electrode. And it can be seen that the efficiency Eff of the solar cell increases as the contact ratio between the second contact layer and the second electrode decreases, and the efficiency Eff of the solar cell is highest when the contact ratio between the second contact layer and the second electrode is 10%.

In order to effectively improve the efficiency of the solar cell in consideration of both the optical performance and the electrical performance, the second contact layer 150 is formed such that the contact ratio between the second contact layer 150 and the second electrode 160 is 10% to 50%.

The second contact layer 150 is formed in various shapes in a state where the contact ratio between the second contact layer 150 and the second electrode 160 is maintained within the above range (10% to 50%).

Figure 6:
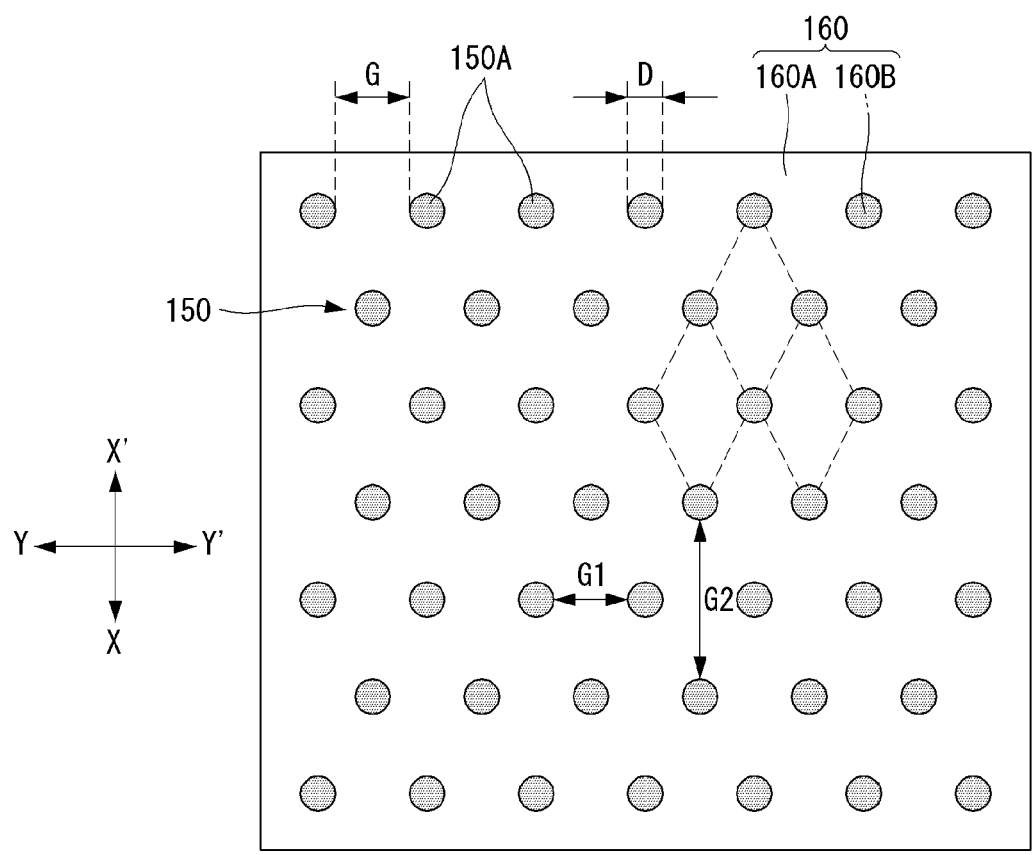
FIG. 6 is a plan view of the second contact layer shown in FIG. 2 according to the first implementation.

For example, as shown in FIG. 6, the second contact layer 150 may include a plurality of circular dots 150 A that are formed to have the same size as each other and are uniformly arranged apart from each other.

At this time, when the size D of the circular dot 150A is less than 5 μm, the process margin in the etching process is too small, and there is a possibility that the circular dot 150A is lost. When the size D of the circular dots 150 exceeds 100 μm, the gap G between the circular dots 150A is too large, so that the collection efficiency of the carrier is lowered, thereby electrical performance decreases. Therefore, it is preferable that each circular dot 150A is formed to have a size (D) or diameter of 5 μm to 100 μm.

Considering the efficiency of the solar cell, the sum of the areas of the plurality of circular dots 150A is from 10% to 50% of the area of the light absorbing layer PV or the area of the second electrode 160. In some implementations, the sum of the areas of the plurality of circular dots 150A is 10% of the area of each of the light absorbing layer PV and the second electrode 160. In these implementations, the areas can represent areas in a particular plane, e.g., an X-Y plane The plurality of circular dots 150 may be arranged in a rhombic shape as shown by a dotted line. In this instance, to form the sum of areas of the plurality of circular dots 150A from 10% to 50% of the area of the light absorbing layer PV or the area of the second electrode 160, a distance G1 between two dots arranged in any one column of the four dots arranged in one rhomboid shape may be 10 μm to 200 μm, and a distance G2 between two dots arranged in any one row of the four dots arranged in one rhombic shape may be 15 μm to 350 μm.

Figure 7:
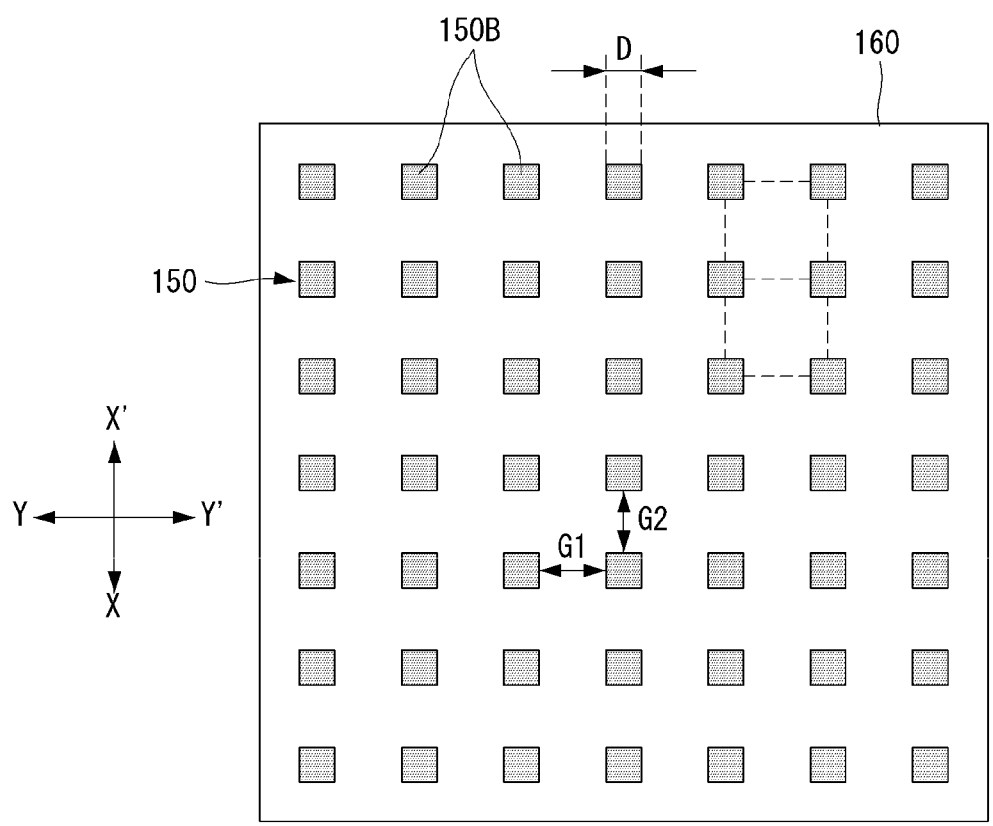
FIG. 7 is a plan view of the second contact layer shown in FIG. 2 according to the second implementation.

As another example, as shown in FIG. 7, the second contact layer 150 may be formed of a plurality of rectangular dots 150B, and the plurality of rectangular dots 150B may be uniformly arranged in a lattice shape as shown by a dotted line.

At this time, each of the rectangular dots 150B may be formed to have a size D of 5 μm to 100 μm, like the circular dots 150A, and the sum of the areas of the plurality of rectangular dots 150B is from 10% to 50% of the area of the light absorbing layer PV or the area of the second electrode 160. In some implementations, the sum of the areas for the plurality of rectangular dots 150B is 10% of the area of the light absorbing layer PV or the area of the second electrode 160. In these implementations, the areas can represent areas in a particular plane, e.g., an X-Y plane In a case where the plurality of rectangular dots 150B are arranged in a lattice shape, in the four dots arranged in a lattice form, the distance G1 between two dots arranged in any one column may be 10 μm to 200 μm, and the distance G2 between two dots arranged in any one row may be 10 μm to 200 μm.

However, a plurality of rectangular dots 150B may be arranged in a rhombic shape as shown in FIG. 6, and a plurality of circular dots 150A may be arranged in a lattice shape as shown in FIG. 7.

Figure 8:
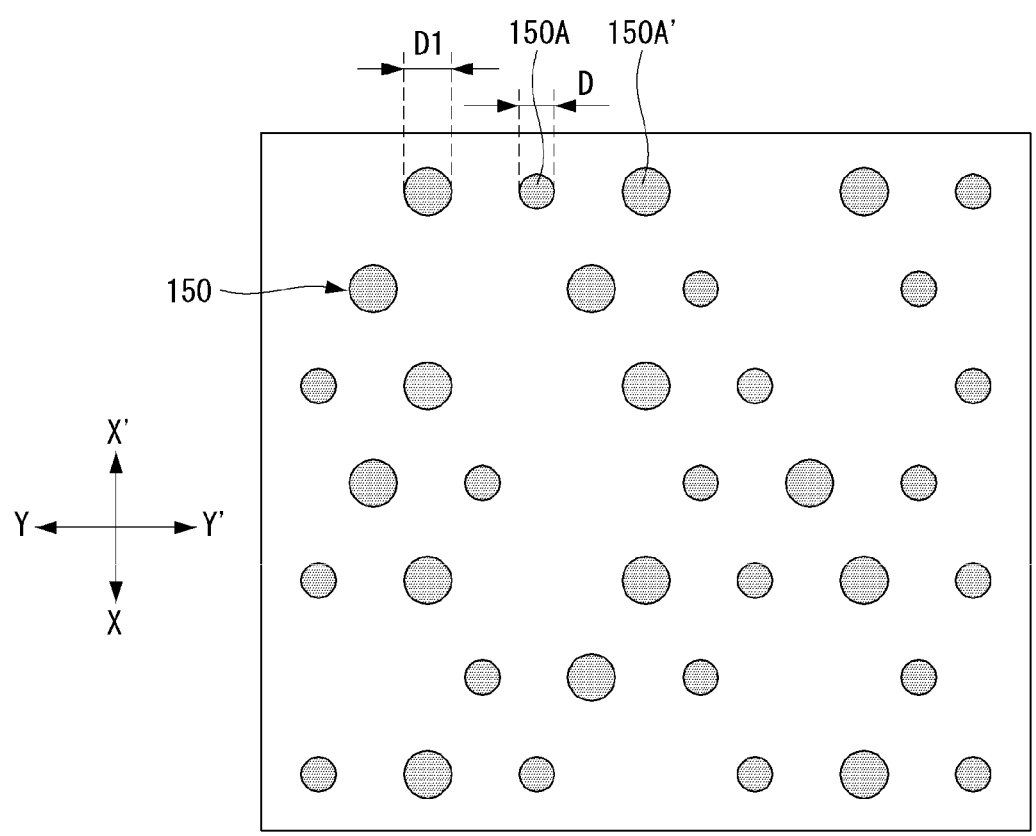
FIG. 8 is a plan view of the second contact layer shown in FIG. 2 according to the third implementation.

As another example, as shown in FIG. 8, the plurality of circular dots 150A and 150A" or rectangular dots 150B may have at least two sizes D and D1 different from each other within a range of 5 μm to 100 μm. And the plurality of circular dots 150A and 150A' or the rectangular dots 150B may be randomly arranged, unlike in FIGS. 6 and 7.

However, the plurality of dots 150A and 150A' having different sizes may be arranged uniformly in a lattice shape or a rhombus shape, and the plurality of dots having the same size may be arranged randomly.

In the above description, the second contact layer is formed of circular or rectangular dots. However, the planar shape of the dots can be modified in various ways, and the layout of the plurality of dots can be modified in various ways.

Figure 9:
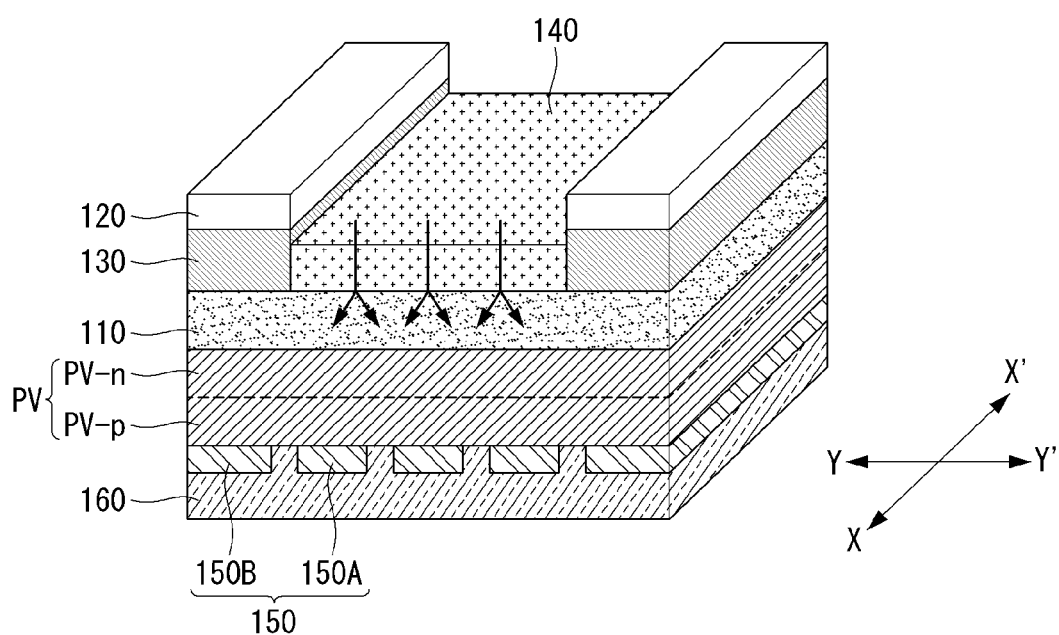
FIG. 9 is a perspective view for explaining a compound semiconductor solar cell according to a modified example of the second contact layer shown in FIG. 2.

As another example, as shown in FIG. 9, the second contact layer 150 may include the plurality of dots 150A or 150B, a linear portion 150C disposed on the rear surface of the light absorbing layer PV in a region overlapping the first electrode 120 on the projection surface.

At this time, the linear portion 150C and the first electrode 120 may be formed in the same area or may be formed in different areas.

In the instance where the second contact layer 150 further includes the linear portion 150C in addition to the plurality of dots, the contact ratio between the second contact layer 150 and the second electrode 160 may exceed 50%.

That is, since the contact ratio between the plurality of dots and the second electrode is 10% to 50%, in the case of the second contact layer including the linear portion 150C in addition to the plurality of dots, the contact ratio of the second contact layer and the second electrode may be increased by the area in which the linear portion and the second electrode are in contact with each other.

Figure 10:
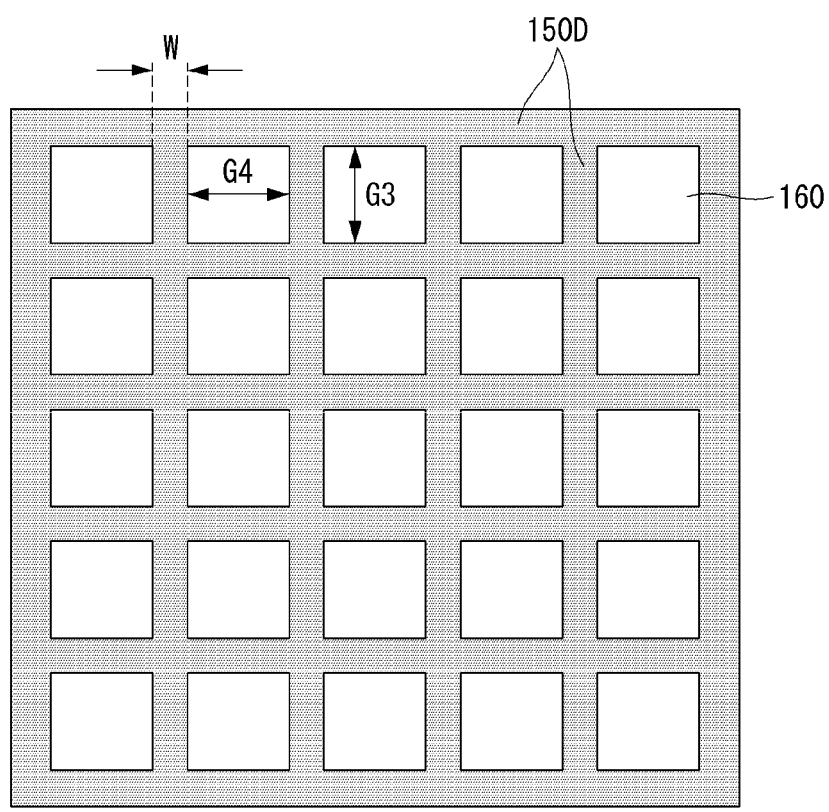
FIG. 10 is a plan view of the second contact layer shown in FIG. 2 according to the fourth implementation.

FIG. 10 illustrates a second contact layer according to another implementation of the present invention, wherein the second contact layer 150 of the present implementation includes a plurality of first linear portions 150D spaced apart from each other. In some implementations, the sum of the areas of the plurality of first linear portions 150D may be from 10% to 50% of the area of the light absorbing layer PV or the area of the second electrode 160. In some implementations, the sum of the areas of the plurality of first linear portions 150D may be 10% of the area of the light absorbing layer PV or the area of the second electrode 160. In these implementations, the areas can represent areas in a particular plane, e.g., an X-Y plane The plurality of first linear portions 150D may be formed in a lattice pattern, and may be formed to have the same line width W. For example, the line width W may be 1.2 μm.

At this time, two first linear portions 150D adjacent to each other in the first direction X-X' may be arranged to maintain a gap G3 of 30 μm to 200 μm along the first direction. And two first linear portions 150D adjacent to each other in a second direction Y-Y' perpendicular to the first direction are arranged to maintain a gap G4 of 30 μm to 200 μm along the second direction.

However, the first linear portion 150D may be formed only in the first direction X-X' or may be formed only in the second direction Y-Y'. Or the first linear portion 150D may be formed in a wavy shape.

When the first linear portion 150D is formed only in the first direction or the second direction, in order to keep the contact ratio between the first linear portion and the second electrode at 10% to 50%, the gap between two adjacent first linear portions may be smaller than the gap shown in FIG. 10.

At least a part of the first linear portion 150D may overlap the first electrode 120 on the projection plane.

A compound semiconductor solar cell having such a configuration can be formed by an epitaxial lift-off (ELO) method, specifically, epitaxially growing a sacrificial layer on a mother substrate, epitaxially growing a first or a second contact layer on the sacrificial layer, epitaxially growing a light absorbing layer on the first or second contact layer, epitaxially growing the second or the first contact layer on the light absorbing layer, separating the light absorbing layer and the first and second contact layers from the mother substrate by removing the sacrificial layer by an epitaxial lift-off process, patterning the first contact layer and forming a first electrode, and patterning the second contact layer and forming the second electrode.

On the other hand, when the first and second contact layers located on both sides of the light absorption layer are epitaxially grown, the n-type impurity is difficult to be doped as compared with the p-type impurity. As a result, a special method called a delta method is used to dope the impurity. When the n-type impurity is doped using the delta method, the light absorbing layer may be damaged due to the high temperature process.

Therefore, when the contact layer located on the light receiving surface of the compound semiconductor solar cell has n-type, it is preferable to form the contact layer located on the light receiving surface earlier than the contact layer located on the opposite surface of the light receiving surface. Also, when the contact layer located on the light receiving surface of the semiconductor solar cell has p-type, it is preferable to form the contact layer located on the opposite surface of the light receiving surface earlier than the contact layer located on the light receiving surface.

Although the compound semiconductor solar cell includes one light absorbing layer in the above description, the light absorbing layer may be formed in plural numbers.

In this case, the lower light absorbing layer may include a GaAs compound that absorbs light in a long wavelength band and performs photoelectric conversion, and the upper light absorbing layer may include an InGaP compound that absorbs light in a short wavelength band and performs photoelectric conversion. A tunnel junction layer may be positioned between the upper light absorbing layer and the lower light absorbing layer.

Further, an intrinsic semiconductor layer may be further formed between the p-type semiconductor layer and the n-type semiconductor layer of the light absorbing layer.

What is claimed is:

1. A compound semiconductor solar cell, comprising:
    a light absorbing layer comprising a first compound semiconductor epitaxial layer that has a first conductive type and a second compound semiconductor epitaxial layer that has a second conductive type and is positioned on an inside surface of the first compound semiconductor epitaxial layer;
    a window layer disposed at a front surface of the second compound semiconductor epitaxial layer;
    a front epitaxial contact layer that that has the second conductive type and is disposed at a front side of the window layer;
    an anti-reflection film that is disposed at the front side of the window layer;
    a first electrode that is positioned on the front epitaxial contact layer;
    a back epitaxial contact layer at least partially positioned on an outside surface of the first compound semiconductor epitaxial layer facing opposite to the inside surface, the back epitaxial contact layer having the first conductive type and an impurity concentration that is greater than an impurity concentration of impurities contained in the first compound semiconductor epitaxial layer; and
    a second electrode that is positioned on the back epitaxial contact layer, the second electrode including (i) a plurality of first portions that directly contact the back epitaxial contact layer and form ohmic contact with the back epitaxial contact layer and (ii) a plurality of second portions that directly contact the outside surface of the first compound semiconductor epitaxial layer,
    wherein the plurality of first portions and the plurality of second portions are made of a same material.

2. The compound semiconductor solar cell of claim 1, wherein each of the plurality of second portions is 100 nm to 300 nm thicker than each of the plurality of first portions.

3. The compound semiconductor solar cell of claim 2, wherein a thickness of the back epitaxial contact layer is from 100 nm to 300 nm
wherein a first distance between each of the plurality of first portions and a back surface of the second electrode is less than a second distance between each of the plurality of second portions and the back surface of the second electrode, and
wherein a thickness of each of the plurality of second portions is the same or substantially similar to a sum of the first distance and the thickness of the back epitaxial contact layer.

4. The compound semiconductor solar cell of claim 2, wherein the back epitaxial contact layer includes a plurality of dots that are spaced apart from each other.

5. The compound semiconductor solar cell of claim 4, wherein a sum of areas of the plurality of dots is from 10% to 50% of an area of the light absorbing layer or an area of the second electrode.

6. The compound semiconductor solar cell of claim 5, wherein the plurality of dots have a circular, an elliptical, or a quadrangular planar shape and have one or more sizes that are within a first range from 5 µm to 100 µm.

7. The compound semiconductor solar cell of claim 6, wherein the plurality of dots have a first size that is within the first range.

8. The compound semiconductor solar cell of claim 6, wherein the plurality of dots have at least two different sizes that are within the first range.

9. The compound semiconductor solar cell of claim 5, wherein the plurality of dots are uniformly arranged on the back epitaxial contact layer.

10. The compound semiconductor solar cell of claim 9, wherein the plurality of dots are arranged in a lattice shape, and
wherein a distance between two adjacent first dots of the plurality of dots is from 10 µm to 200 µm, the two adjacent first dots being arranged in a first direction.

11. The compound semiconductor solar cell of claim 10, wherein a distance between two adjacent second dots of the plurality of dots is from 10 µm to 200 µm, the two adjacent second dots being arranged in a second direction that is different from the first direction.

12. The compound semiconductor solar cell of claim 9, wherein the plurality of dots are arranged in a rhomboid shape, and
wherein a distance between two adjacent dots of the plurality dots is from 15 µm to 350 µm.

13. The compound semiconductor solar cell of claim 5, wherein the back epitaxial contact layer comprises: a linear portion that is located below the first electrode.

14. The compound semiconductor solar cell of claim 1, wherein the back epitaxial contact layer comprises:
a plurality of first linear portions spaced apart from each other.

15. The compound semiconductor solar cell of claim 14, wherein a sum of areas of the plurality of first linear portions is from 10% to 50% of an area of the light absorbing layer or an area of the second electrode.

16. The compound semiconductor solar cell of claim 15, wherein the plurality of first linear portions have a lattice pattern.

17. The compound semiconductor solar cell of claim 16, wherein the plurality of first linear portions have a first width in a third direction.

18. The compound semiconductor solar cell of claim 14, wherein a first distance between two adjacent first linear portions, of the plurality of first linear portions, that are arranged in a first direction is from 30 µm to 200 µm, and
wherein a second distance between two adjacent first linear portions, of the plurality of first linear portions that are arranged in a second direction that is orthogonal to the first direction is from 30 µm to 200 µm.

19. The compound semiconductor solar cell of claim 1, wherein the plurality of first portions are spaced apart from one another in a first direction,
wherein each of the plurality of first portions is disposed between two of the plurality of second portions, and
wherein each of the plurality of second portions is disposed between two of the plurality of first portions.

20. The compound semiconductor solar cell of claim 19, wherein a first width of each of the plurality of first portions in the first direction is greater than a second width of each of the plurality of second portions.

* * * * *